US012771333B2

(12) United States Patent
Pyo et al.

(10) Patent No.: US 12,771,333 B2
(45) Date of Patent: Oct. 20, 2026

(54) COMPARATOR AND SEMICONDUCTOR APPARATUS USING THE SAME

(71) Applicant: SK hynix Inc., Icheon-si (KR)

(72) Inventors: Chang Hyun Pyo, Icheon-si (KR); Hyun Kyu Park, Icheon-si (KR); Dong Wook Jang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 15 days.

(21) Appl. No.: 19/083,094

(22) Filed: Mar. 18, 2025

(65) Prior Publication Data

US 2026/0149444 A1 May 28, 2026

(30) Foreign Application Priority Data

Nov. 25, 2024 (KR) ........................ 10-2024-0169698

(51) Int. Cl.
*H03K 5/24* (2006.01)

(52) U.S. Cl.
CPC ........... *H03K 5/249* (2013.01); *H03K 5/2481* (2013.01)

(58) Field of Classification Search
CPC ............................. H03K 5/249; H03K 5/2481
See application file for complete search history.

(56) References Cited

U.S. PATENT DOCUMENTS 5,498,982 A 3/1996 Gopinathan et al.
5,638,317 A * 6/1997 Tran .................... G11C 11/4096 365/205
7,652,600 B2 1/2010 Van der Plas et al.
7,880,506 B2 * 2/2011 Felix ................ H03K 3/356139 326/98
10,756,748 B1 * 8/2020 Khatavkar ........... H03H 19/004
10,778,204 B1 * 9/2020 Wang ..................... H03K 5/249
10,855,305 B2 * 12/2020 Eitan ....................... H03M 1/38
11,451,196 B1 * 9/2022 Hsieh ...................... H03M 1/36
11,909,401 B2 * 2/2024 Dey ......................... H03K 5/24
2004/0047184 A1 * 3/2004 Tran ....................... G11C 7/065 365/185.21
2006/0176085 A1 * 8/2006 Wakamatsu ......... H03K 5/2481 327/63
2008/0024174 A1 * 1/2008 Wong ................... H03K 19/007 327/58
2008/0303592 A1 * 12/2008 Deguchi ............. H03F 3/45659 330/252
2008/0315924 A1 * 12/2008 Su .................... H03K 3/356113 327/87
2013/0176156 A1 * 7/2013 Danjo .................... H03K 5/249 327/64

(Continued)

FOREIGN PATENT DOCUMENTS

CN 117200794 A * 12/2023
CN 121150666 A * 12/2025

(Continued)

*Primary Examiner* — Adam D Houston
(74) *Attorney, Agent, or Firm* — WILLIAM PARK AND ASSOCIATES LTD.

(57) ABSTRACT

A comparator includes an amplification circuit and a latch circuit. The amplification circuit generates a first amplification signal and a second amplification signal based on a clock signal, an input signal, and a reference voltage. The latch circuit generates a first output signal and a second output signal based on the clock signal, the first amplified signal, and the second amplified signal.

25 Claims, 6 Drawing Sheets

(56) References Cited

U.S. PATENT DOCUMENTS

| | | | | |
|---|---|---|---|---|
| 2016/0202715 | A1* | 7/2016 | Petrov | G05F 1/56 323/280 |
| 2024/0428822 | A1* | 12/2024 | Yang | G11B 20/1423 |
| 2025/0357923 | A1* | 11/2025 | Terryn | H03K 5/2481 |
| 2026/0045942 | A1* | 2/2026 | Cristofoli | H03K 5/2481 |
| 2026/0081586 | A1* | 3/2026 | Raimar | H03K 5/249 |

FOREIGN PATENT DOCUMENTS

| | | | | |
|---|---|---|---|---|
| DE | 112021002683 B4 * | 2/2025 | | H03F 3/45977 |
| EP | 0688100 A2 * | 12/1995 | | H03K 3/012 |
| WO | WO-2021072251 A1 * | 4/2021 | | H03K 5/24 |

* cited by examiner

COMPARATOR AND SEMICONDUCTOR APPARATUS USING THE SAME

CROSS-REFERENCES TO RELATED APPLICATION

The present application claims priority under 35 U.S.C. § 119(a) to Korean Patent Application No. 10-2024-0169698, filed in the Korean Intellectual Property Office on Nov. 25, 2024, the entire contents of which application is incorporated herein by reference.

BACKGROUND

1. Technical Field

The present disclosure relates to integrated circuits, including but not limited to a comparator and a semiconductor apparatus using the comparator.

2. Related Art

An electronic device includes numerous electronic components, among which a computer system includes many semiconductor apparatus including semiconductor devices. Semiconductor apparatus included in the computer system communicate with each other by transmitting and receiving system clock signals and data signals. The semiconductor apparatus operates in synchronization with the system clock signals. As operating speed of the computer system and frequency of the system clock signals increase, pulse widths and amplitudes of the system clock signal and the data signal gradually decrease.

A semiconductor apparatus may include a comparator that receives a data signal transmitted from another semiconductor apparatus. The comparator may generate an output signal corresponding to the data signal by differentially amplifying the data signal and a reference voltage in synchronization with a clock signal. A semiconductor apparatus may use a comparator having a strong-arm latch structure. A comparator with the strong-arm latch structure has the advantage of low power consumption and implementation with a small number of transistors.

SUMMARY

In an embodiment, a comparator may include an amplification circuit and a latch circuit. The amplification circuit may be configured to generate a first amplified signal and a second amplified signal by differentially amplifying an input signal and a reference voltage when a clock signal is at a first logic level and to reset the first amplified signal and the second amplified signal when the clock signal is at a second logic level. The latch circuit may be configured to generate a first output signal and a second output signal based on the first amplified signal and the second amplified signal when the clock signal is at the first logic level and to reset the first output signal and the second output signal when the clock signal is at the second logic level.

The amplification circuit may include a first amplification node, a second amplification node, a first transistor, a second transistor, a third transistor, and a fourth transistor. The first amplification node and the second amplification node may be coupled to a first power supply voltage based on the clock signal. The first transistor may be coupled to a second power supply voltage and may be configured to receive the input signal. The second transistor may be configured to couple the first amplification node to the first transistor based on the clock signal. The third transistor may be coupled to the second power supply voltage and may be configured to receive the reference voltage. The fourth transistor may be configured to couple the second amplification node and the third transistor based on the clock signal. The first amplified signal may be output on the first amplification node, and the second amplified signal may be output on the second amplification node.

In an embodiment, a comparator may include an amplification circuit and a latch circuit. The amplification circuit may be configured to generate a first amplified signal and a second amplified signal by differentially amplifying an input signal and a reference voltage when a clock signal is at a first logic level and to reset the first amplified signal and the second amplified signal when the clock signal is at a second logic level. The latch circuit may be configured to generate a first output signal and a second output signal based on the first amplified signal and the second amplified signal when the clock signal is at the first logic level and to reset the first output signal and the second output signal when the clock signal is at the second logic level.

The amplification circuit may include a first amplification node, a second amplification node, a first transistor, a second transistor, a third transistor, a fourth transistor, a first compensation circuit, and a second compensation circuit. The first amplification node and a second amplification node may be coupled to a first power supply voltage based on the clock signal. The first transistor may be coupled to a second power supply voltage and may be configured to receive the input signal. The second transistor configured to couple the first amplification node to the first transistor based on the clock signal. The third transistor may be coupled to the second power supply voltage and may be configured to receive the reference voltage. The fourth transistor may be configured to couple the second amplification node and the third transistor based on the clock signal. The first compensation circuit may be configured to change a voltage level at the first amplification node based on the reference voltage. The second compensation circuit configured to change a voltage level at the second amplification node based on the input signal. The first amplified signal may be output on the first amplification node, and the second amplified signal may be output on the second amplification node.

In an embodiment, a comparator may include an amplification circuit and a latch circuit. The amplification circuit may be configured to generate a first amplified signal and a second amplified signal by differentially amplifying an input signal and a reference voltage when a clock signal is at a first logic level and to reset the first amplified signal and the second amplified signal when the clock signal is at a second logic level. The latch circuit may be configured to generate a first output signal and a second output signal based on the first amplified signal and the second amplified signal when the clock signal is at the first logic level and to reset the first output signal and the second output signal when the clock signal is at the second logic level.

The amplification circuit may include a first input circuit, a second input circuit, a first compensation circuit, and a second compensation circuit. The first input circuit may be configured to decrease a voltage level at a first amplification node when the input signal is at or above a first voltage level. The first amplified signal may be output on the first amplification node. The second input circuit may be configured to decrease a voltage level at a second amplification node when the reference voltage is at or above the first voltage level. The second amplified signal may be output on the second amplification node. The first compensation circuit may be configured to decrease the voltage level at the first amplification node when the reference voltage is at or below a second voltage level. The second compensation circuit may be configured to decrease the voltage level at the second amplification node when the input signal is at or below the second voltage level.

In an embodiment, an amplification circuit may include a first input circuit, a second input circuit, a first compensation circuit, and a second compensation circuit. The first input circuit may be configured to change a voltage level at an amplification node when an input signal is at or above a first voltage level, such that a first amplified signal is output on the first amplification node. The second input circuit may be configured to change a voltage level at a second amplification node when a reference voltage is at or above a first voltage level, such that a second amplified signal is output on the second amplification node. The first compensation circuit may be configured to decrease a voltage level at the first amplification node when the reference voltage is at or below a second voltage level. The second compensation circuit may be configured to decrease the voltage level at the second amplification node when the input signal is at or below the second voltage level.

DETAILED DESCRIPTION

Embodiments of the present disclosure are described in detail with reference to the accompanying drawings. Specific structural or functional descriptions of embodiments are provided as examples to describe concepts that are disclosed in the present application. Examples or embodiments in accordance with the concepts may be carried out in various forms, and the scope of the present disclosure is not limited to the examples or embodiments described in this specification.

When one element is identified as "connected" or "coupled" to another element, the elements may be connected or coupled directly or through at least one intervening element between the elements. When two elements are identified as "directly connected" or "directly coupled," one element is directly connected or directly coupled to the other element without an intervening element between the two elements.

A comparator having a strong-arm latch structure has the disadvantage of vulnerability to kickback noise. Accordingly, in the semiconductor apparatus, a comparator with a double-tail latch structure, which is insensitive to or unaffected by kickback noise and fluctuations in input common mode voltage, may be utilized instead of a comparator with a strong-arm latch structure. As finer manufacturing processes are used produce the semiconductor apparatus, the power supply voltage of the semiconductor apparatus may decrease. As the power supply voltage decreases, impact of kickback noise on output signal distortion becomes greater. A comparator capable of reducing kickback noise is advantageous.

Figure 1:
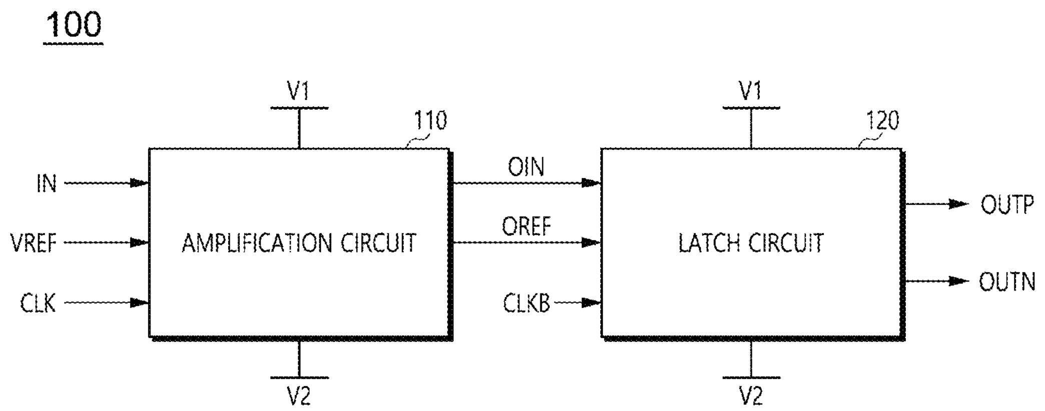
FIG. 1 is a block diagram illustrating a configuration of a comparator according to an embodiment.

FIG. 1 is a block diagram illustrating a configuration of a comparator 100 according to an embodiment. Referring to FIG. 1, the comparator 100 receives an input signal IN and a reference voltage VREF and generates a first output signal OUTP and a second output signal OUTN. The reference voltage VREF may be at a voltage level corresponding to an intermediate level of a swing range of the input signal IN. The comparator 100 receives a clock signal CLK and performs a comparison operation in synchronization with the clock signal CLK. When the clock signal CLK is at a first logic level, the comparator 100 generates the output signals OUTP and OUTN by comparing the input signal IN with the reference voltage VREF. A logic level of the first output signal OUTP correspond to a logic level of the input signal IN. The second output signal OUTN is at a logic level opposite to the input signal IN. Opposite logic levels include, for example, a high logic level and a low logic level, which may correspond to a binary 1 and a binary 0. When the clock signal CLK is at a second logic level, the comparator 100 resets the output signals OUTP and OUTN regardless of the voltage levels of the input signal IN and the reference voltage VREF.

The comparator 100 has a double-tail latch structure and includes two stages coupled in series. A first stage is an amplification circuit 110 and a second stage is a latch circuit 120. The amplification circuit 110 receives the input signal IN, the reference voltage VREF, and the clock signal CLK and generates a first amplified signal OIN and a second amplified signal OREF. When the clock signal CLK is at the first logic level, the amplification circuit 110 generates the amplified signals OIN and OREF by differentially amplifying the input signal IN and the reference voltage VREF, respectively. For example, the second amplified signal OREF is at a logic level corresponding to the logic level of the input signal IN, and the first amplified signal OIN is at a logic level opposite to a logic level of the input signal IN. When the clock signal CLK is at the second logic level, the amplification circuit 110 resets the amplified signals OIN and OREF regardless of a voltage level difference between the input signal IN and the reference voltage VREF. The amplification circuit 110 receives a first power supply voltage V1 and a second power supply voltage V2 and operates using the received power supply voltages V1 and V2. The first power supply voltage V1 is at a voltage level higher than the second power supply voltage V2. The first power supply voltage V1 is at a voltage level sufficiently high to drive a signal at a high logic level. The second power supply voltage V2 is at a voltage level sufficiently low to drive a signal at a low logic level. For example, the amplification circuit 110 resets the amplified signals OIN and OREF to the voltage level at the first power supply voltage V1. The amplification circuit 110, when differentially amplifying the input signal IN and the reference voltage VREF, amplifies one (a first) of the amplified signals OIN and OREF to the voltage level at the second power supply voltage V2 and amplifies the other (a second) of the amplified signals OIN and OREF to the voltage level at the first power supply voltage V1.

The latch circuit 120 generates the output signals OUTP and OUTN based on the first amplified signal OIN, the second amplified signal OREF, and the clock signal CLK. The latch circuit 120 receive the first amplified signal OIN, the second amplified signal OREF, and a complementary signal CLKB of the clock signal CLK. The complementary signal CLKB of the clock signal CLK has a phase opposite to a phase of the clock signal CLK, in other words, the complementary signal CLKB has opposite logic levels to the clock signal CLK. When the clock signal CLK is at a first logic level and the complementary signal CLKB of the clock signal CLK is at a second logic level, the latch circuit 120 amplifies a voltage level difference between the first amplified signal OIN and the second amplified signal OREF and generate the output signals OUTP and OUTN. For example, the first output signal OUTP is at a logic level opposite to the logic level of the first amplified signal OIN, and the second output signal OUTN is at a logic level opposite to the logic level of the second amplified signal OREF. When the clock signal CLK is at a second logic level and the complementary signal CLKB of the clock signal CLK is at a first logic level, the latch circuit 120 resets the output signals OUTP and OUTN. The latch circuit 120 receives the power supply voltages V1 and V2 and operates using the received power supply voltages V1 and V2. For example, the latch circuit 120 resets the output signals OUTP and OUTN to the voltage level at the second power supply voltage V2. The latch circuit 120, when amplifying the amplified signals OIN and OREF, amplifies one (a first) of the output signals OUTP and OUTN to the voltage level at the second power supply voltage V2 and amplifies the other (a second) of the output signals OUTP and OUTN to the voltage level at the first power supply voltage V1.

The amplification circuit 110 is an amplifier of a type opposite to a type of the latch circuit 120. For example, the amplification circuit 110 is an N-type amplifier, and the latch circuit 120 is a P-type amplifier. The N-type amplifier is an amplifier in which a transistor that receives an input signal is an N-channel metal-oxide-semiconductor (MOS) transistor, and the P-type amplifier is an amplifier in which a transistor that receives an input signal is a P-channel MOS transistor. The amplification circuit 110 includes N-channel MOS transistors that receive the input signal IN and the reference voltage VREF, and the latch circuit 120 includes P-channel MOS transistors that receive the first amplified signal OIN and the second amplified signal OREF. In an embodiment, the amplification circuit 110 is a P-type amplifier, and the latch circuit 120 is an N-type amplifier. The amplification circuit 110 may be a structure that is insensitive to or unaffected by kickback noise.

Figure 2:
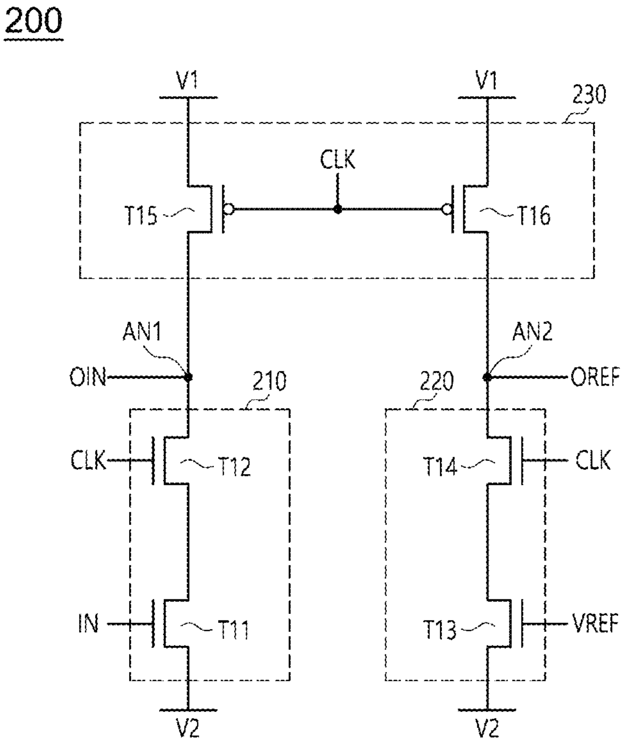
FIG. 2 is a diagram illustrating a configuration of an amplification circuit according to an embodiment.

FIG. 2 is a diagram illustrating a configuration of an amplification circuit 200 according to an embodiment. The amplification circuit 110 illustrated in FIG. 1 may be implemented utilizing the amplification circuit 200. Referring to FIG. 2, the amplification circuit 200 includes a first input circuit 210 and a second input circuit 220. The first input circuit 210 changes the voltage level at a first amplification node AN1 based on the input signal IN and the clock signal CLK. The first amplified signal OIN is output on the first amplification node AN1. When the clock signal CLK is at a first logic level, the first input circuit 210 changes the voltage level at the first amplification node AN1 according to the voltage level at the input signal IN. The first input circuit 210 increases the amount of current flowing through the first input circuit 210 as the voltage level at the input signal IN increases, thereby reducing the voltage level at the first amplification node AN1. When the clock signal CLK is at a second logic level, the first input circuit 210 does not change the voltage level at the first amplification node AN1. The second input circuit 220 changes the voltage level at a second amplification node AN2 based on the reference voltage VREF and the clock signal CLK. The second amplified signal OREF is output on the second amplification node AN2. When the clock signal CLK is at a first logic level, the second input circuit 220 changes the voltage level at the second amplification node AN2 according to the voltage level of the reference voltage VREF. The second input circuit 220 facilitates constant current to flow through the second input circuit 220 based on the voltage level of the reference voltage VREF. When the clock signal CLK is at a second logic level, the second input circuit 220 does not change the voltage level at the second amplification node AN2.

The amplification circuit 200 includes a reset circuit 230. The reset circuit 230 resets the amplified signals OIN and OREF based on the clock signal CLK. When the clock signal CLK is at a second logic level, the reset circuit 230 resets the amplified signals OIN and OREF. When the clock signal CLK is at a first logic level, the reset circuit 230 releases the reset state of the amplified signals OIN and OREF.

The first input circuit 210 includes a first transistor T11 and a second transistor T12. The first transistor T11 is coupled to the second power supply voltage V2 and receives the input signal IN. A gate of the first transistor T11 receives the input signal IN, and a source of the first transistor T11 is coupled to the second power supply voltage V2. The second transistor T12 couples the first amplification node AN1 to the first transistor T11 based on the clock signal CLK. A gate of the second transistor T12 receives the clock signal CLK. A drain of the second transistor T12 is coupled to the first amplification node AN1. A source of the second transistor T12 is coupled to a drain of the first transistor T11. The transistors T11 and T12 are transistors of the same or similar type, and each may be an N-channel MOS transistor.

The second input circuit 220 includes a third transistor T13 and a fourth transistor T14. The third transistor T13 is coupled to the second power supply voltage V2 and receives the reference voltage VREF. A gate of the third transistor T13 receives the reference voltage VREF, and a source of the third transistor T13 is coupled to the second power supply voltage V2. The fourth transistor T14 couples the second amplification node AN2 to the third transistor T13 based on the clock signal CLK. A gate of the fourth transistor T14 receives the clock signal CLK. A drain of the fourth transistor T14 is coupled to the second amplification node AN2. A source of the fourth transistor T14 is coupled to a drain of the third transistor T13. The transistors T13 and T14 are transistors of the same type as the transistors T11 and T12, and each may be an N-channel MOS transistor.

The reset circuit 230 includes a fifth transistor T15 and a sixth transistor T16. The fifth transistor T15 couples the first power supply voltage V1 and the first amplification node AN1 based on the clock signal CLK A gate of the fifth transistor T15 receives the clock signal CLK. A source of the fifth transistor T15 is coupled to the first power supply voltage V1. A drain of the fifth transistor T15 is coupled to the first amplification node AN1. The sixth transistor T16 couples the node at the first power supply voltage V1 and the second amplification node AN2 based on the clock signal CLK. A gate of the sixth transistor T16 receives the clock signal CLK. A source of the sixth transistor T16 is coupled to the first power supply voltage V1. A drain of the sixth transistor T16 is coupled to the second amplification node AN2. The transistors T15 and T16 are transistors of a type opposite to a type of the transistors T11, T12, T13, and T14, and transistors T15 and T16 may each be a P-channel MOS transistor.

In the amplification circuit 200, the source of the first transistor T11, which receives the input signal IN, and the source of the third transistor T13, which receives the reference voltage VREF, are coupled to the second power supply voltage V2. Due to the connection structure of the transistors T11 and T13, the second power supply voltage V2 is steadily applied to a parasitic capacitor formed between the gate and the source of the first transistor T11 and a parasitic capacitor formed between the gate and the source of the third transistor T13. Even when the clock signal CLK transitions from the second logic level to the first logic level, kickback noise in the voltage levels of the input signal IN and the reference voltage VREF may be mitigated and/or prevented. In the example where the amplification circuit 200 mitigates and/or prevents kickback noise, the amplification circuit 200 may accurately generate the amplified signals OIN and OREF corresponding to the voltage level difference between the input signal IN and the reference voltage VREF, thereby rendering the comparator 100 insensitive to or unaffected by the kickback noise and improving the performance of the comparator 100.

Figure 3:
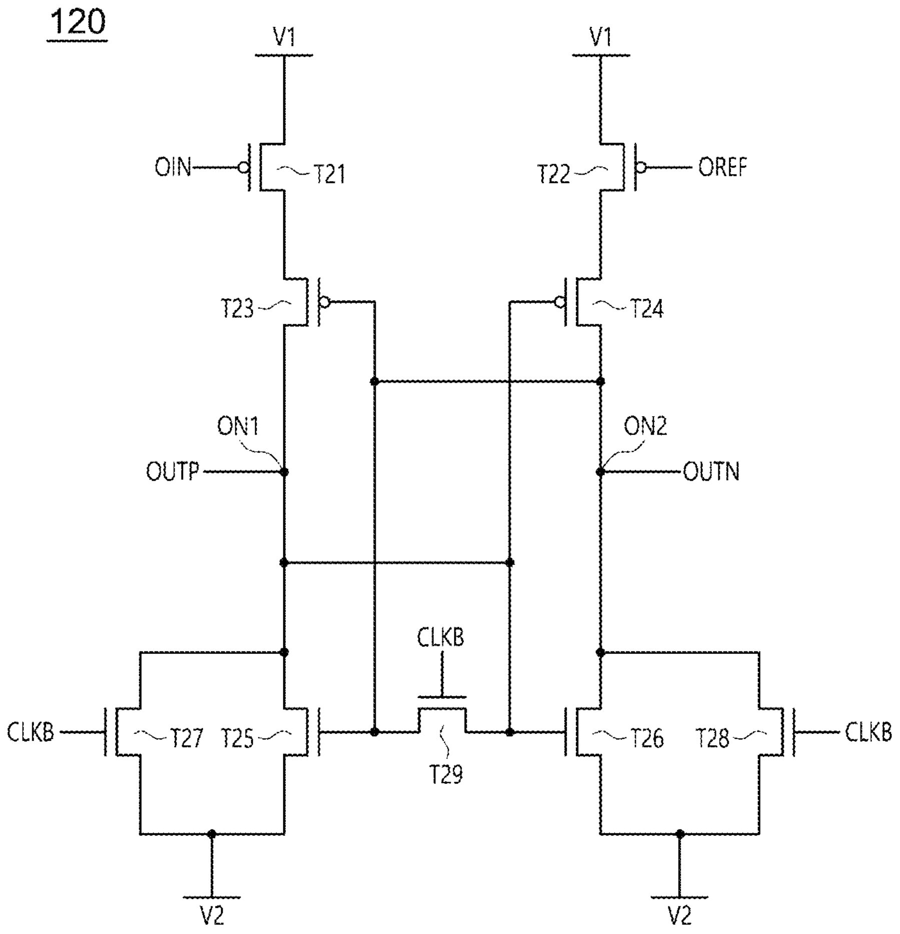
FIG. 3 is a diagram illustrating a configuration of a latch circuit shown according to an embodiment.

FIG. 3 is a diagram illustrating a configuration of the latch circuit 120, for example, as illustrated in FIG. 1. Referring to FIG. 3, the latch circuit 120 includes a first transistor T21, a second transistor T22, a third transistor T23, a fourth transistor T24, a fifth transistor T25, a sixth transistor T26, a seventh transistor T27, an eighth transistor T28, and a ninth transistor T29. The transistors T21 and T22 are transistors of a type opposite to a type of the transistors T11 and T13 of the amplification circuit 200, and transistors T21 and T22 may each be a P-channel MOS transistor. The transistors T23 and T24 may each be a P-channel MOS transistor. The transistors T25 and T26 may each be an N-channel MOS transistor. The transistors T27, T28, and T29 are transistors of a type opposite to a type of the transistors T15 and T16 of the amplification circuit 200, and transistors T27, T28, and T29 may each be an N-channel MOS transistor.

A gate of the first transistor T21 receives the first amplified signal OIN, and a source of the first transistor T11 is coupled to the first power supply voltage V1. A gate of the second transistor T22 receives the second amplified signal OREF, and a source of the second transistor T22 may be coupled to the first power supply voltage V1. A gate of the third transistor T23 is coupled to a second output node ON2. A source of the third transistor T23 is coupled to a drain of the first transistor T21. A drain of the third transistor T23 is connected to a first output node ON1. The first output signal OUTP is output on the first output node ON1, and the second output signal OUTN is output on the second output node ON2. A gate of the fourth transistor T24 is coupled to the first output node ON1. A source of the fourth transistor T24 is coupled to a drain of the second transistor T22. A drain of the fourth transistor T24 is connected to the second output node ON2. A gate of the fifth transistor T25 is coupled to the second output node ON2. A drain of the fifth transistor T25 is coupled to the first output node ON1. A source of the fifth transistor T25 is coupled to the second power supply voltage V2. A gate of the sixth transistor T26 is coupled to the first output node ON1. A drain of the sixth transistor T26 is coupled to the second output node ON2. A source of the sixth transistor T26 is coupled to the second power supply voltage V2. The transistors T23 and T25 form an inverter having an input terminal coupled to the second output node ON2 and an output terminal coupled to the first output node ON1. The transistors T24 and T26 form an inverter having an input terminal coupled to the first output node ON1 and an output terminal coupled to the second output node ON2.

A gate of the seventh transistor T27 receives the complementary signal CLKB of the clock signal CLK. A drain of the seventh transistor T27 is coupled to the first output node ON1. A source of the seventh transistor T27 is coupled to the second power supply voltage V2. A gate of the eighth transistor T28 receives the complementary signal CLKB of the clock signal CLK. A drain of the eighth transistor T28 is coupled to the second output node ON2. A source of the eighth transistor T28 is coupled to the second power supply voltage V2. A gate of the ninth transistor T29 receives the complementary signal CLKB of the clock signal CLK. One of a drain and source of the ninth transistor T29 is coupled to the gate of the fifth transistor T25 and the second output node ON2. The other of the drain and source of the ninth transistor T29 is coupled to the gate of the sixth transistor T26 and the first output node ON1.

When the complementary signal CLKB of the clock signal CLK is at a second logic level, the transistors T27, T28, and T29 are turned on. The seventh transistor T27 drives the voltage at the first output node ON1 to the second power supply voltage V2, and the eighth transistor T28 drives the voltage at the second output node ON2 to the second power supply voltage V2. The ninth transistor T29 couples the first output node ON1 to the second output node ON2. Accordingly, the output nodes ON1 and ON2 re equalized at the voltage level at the second power supply voltage V2, and the output signals OUTP and OUTN are reset to the second power supply voltage V2. The transistors T23 and T24 are turned on based on the output signals OUTP and OUTN. When the complementary signal CLKB of the clock signal CLK is at a first logic level, the transistors T27, T28, and T29 are turned off, and the reset state of the output signals OUTP and OUTN is released. The first transistor T21 supplies current to the source of the third transistor T23 based on the voltage level of the first amplified signal OIN. The second transistor T22 supplies current to the source of the fourth transistor T24 based on the voltage level of the second amplified signal OREF. When the first amplified signal OIN is at a voltage level lower than the second amplified signal OREF, a greater amount of current is supplied to the first output node ON1 through the third transistor T23 than through the fourth transistor T24, thereby causing the voltage level at the first output node ON1 to increase above the voltage level at the second output node ON2. When the voltage level at the first output node ON1 increases, the sixth transistor T26 is turned on, and the voltage level of the second output node ON2 decreases to the voltage level of the second power supply voltage V2. The latch circuit 120 outputs the first output signal OUTP at a high logic level on the first output node ON1 and the second output signal OUTN at a low logic level on the second output node ON2. When the first amplified signal OIN is at a voltage level higher than the second amplified signal OREF, a greater amount of current is supplied to the second output node ON2 through the fourth transistor T24 than through the third transistor T23, thereby causing the voltage level at the second output node ON2 to increase above the voltage level at the first output node ON1. When the voltage level at the second output node ON2 increases, the fifth transistor T25 is turned on, and the voltage level at the first output node ON1 decreases to the voltage level of the second power supply voltage V2. Accordingly, the latch circuit 120 outputs the first output signal OUTP at a low logic level on the first output node ON1 and the second output signal OUTN at a high logic level on the second output node ON2.

Figure 4:
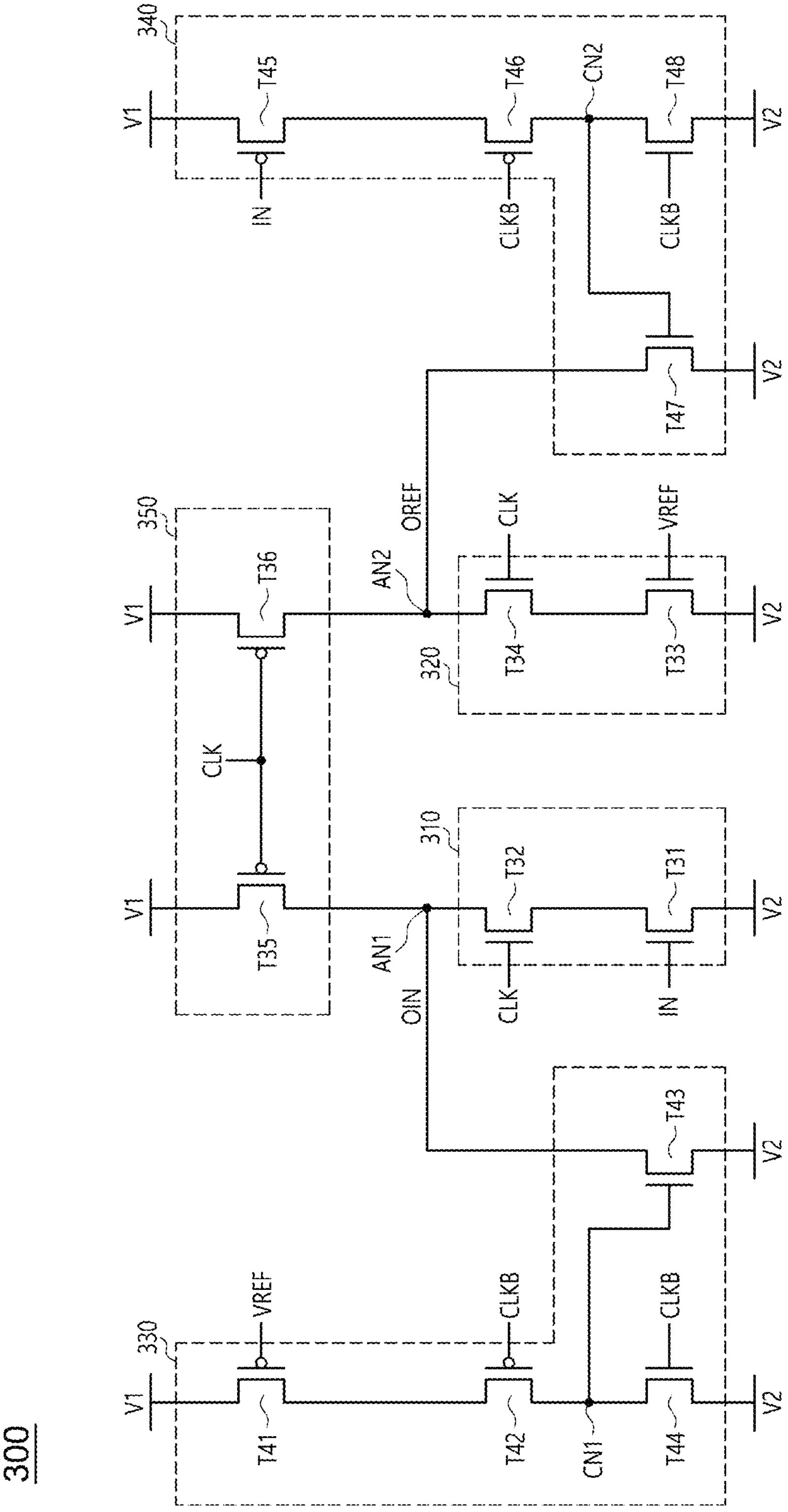
FIG. 4 is a diagram illustrating a configuration of an amplification circuit according to an embodiment.

FIG. 4 is a diagram illustrating a configuration of the amplification circuit 300 according to an embodiment. The amplification circuit 100 illustrated in FIG. 1 may be implemented utilizing the amplification circuit 300. Referring to FIG. 4, the amplification circuit 300 includes a first input circuit 310, a second input circuit 320, a first compensation circuit 330, and a second compensation circuit 340. The first input circuit 310 changes the voltage level at a first amplification node AN1 based on the input signal IN and the clock signal CLK. The first amplified signal OIN is output on the first amplification node AN1. When the clock signal CLK is at a first logic level, the first input circuit 310 changes the voltage level at the first amplification node AN1 according to the voltage level of the input signal IN. The first input circuit 310 increases the amount of current flowing through the first input circuit 310 as the voltage level of the input signal IN increases, thereby reducing the voltage level at the first amplification node AN1. When the clock signal CLK is at a second logic level, the first input circuit 310 does not change the voltage level at the first amplification node AN1. The second input circuit 320 changes the voltage level at a second amplification node AN2 based on the reference voltage VREF and the clock signal CLK. The second amplified signal OREF is output on the second amplification node AN2. When the clock signal CLK is at a first logic level, the second input circuit 320 changes the voltage level at the second amplification node AN2 according to the voltage level of the reference voltage VREF. The second input circuit 320 facilitates constant current to flow through the second input circuit 320 based on the voltage level of the reference voltage VREF. When the clock signal CLK is at a second logic level, the second input circuit 320 does not change the voltage level at the second amplification node AN2.

The first compensation circuit 330 changes the voltage level at the first amplification node AN1 based on the reference voltage VREF and the complementary signal CLKB of the clock signal CLK. The first compensation circuit 330 receives the reference voltage VREF and the complementary signal CLKB of the clock signal CLK. When the complementary signal CLKB of the clock signal CLK is at a second logic level, the first compensation circuit 330 supplies a constant amount of current to the first compensation node CN1 based on the voltage level of the reference voltage VREF. The first compensation circuit 330 reduces the voltage level at the first amplification node AN1 based on the voltage level at the first compensation node CN1. When the complementary signal CLKB of the clock signal CLK is at a first logic level, the first compensation circuit 330 does not change the voltage level at the first amplification node AN1.

The second compensation circuit 340 changes the voltage level at the second amplification node AN2 based on the input signal IN and the complementary signal CLKB of the clock signal CLK. The second compensation circuit 340 receives the input signal IN and the complementary signal CLKB of the clock signal CLK. When the complementary signal CLKB of the clock signal CLK is at a second logic level, the second compensation circuit 340 changes the voltage level at the second compensation node CN2 based on the voltage level of the input signal IN. For example, the second compensation circuit 340 increases the amount of current supplied to the second compensation node CN2 as the voltage level of the input signal IN decreases, thereby raising the voltage level at the second compensation node CN2. The second compensation circuit 340 reduces the voltage level at the second amplification node AN2 based on the voltage level at the second compensation node CN2. The second compensation circuit 340 increases the amount of current flowing from the second amplification node AN2 to the node at the second power supply voltage V2 as the voltage level at the second compensation node CN2 increases, thereby reducing the voltage level at the second amplification node AN2.

The amplification circuit 300 includes a reset circuit 350. The reset circuit 350 resets the amplified signals OIN and OREF based on the clock signal CLK. When the clock signal CLK is at a second logic level, the reset circuit 350 resets the amplified signals OIN and OREF. When the clock signal CLK is at a first logic level, the reset circuit 350 releases the reset state of the amplified signals OIN and OREF.

The first input circuit 310 includes a first transistor T31 and a second transistor T32. The first transistor T31 is coupled to the second power supply voltage V2 and receives the input signal IN. A gate of the first transistor T31 receives the input signal IN, and a source of the first transistor T31 is coupled to the second power supply voltage V2. The second transistor T32 couples the first amplification node AN1 to the first transistor T31 based on the clock signal CLK. A gate of the second transistor T32 receives the clock signal CLK. A drain of the second transistor T32 is coupled to the first amplification node AN1. A source of the second transistor T32 is coupled to a drain of the first transistor T13. The transistors T31 and T32 are transistors of the same type, and each may be an N-channel MOS transistor.

The second input circuit 320 includes a third transistor T33 and a fourth transistor T34. The third transistor T33 is coupled to the second power supply voltage V2 and receives the reference voltage VREF. A gate of the third transistor T33 receives the reference voltage VREF, and a source of the third transistor T33 is coupled to the second power supply voltage V2. The fourth transistor T34 couples the second amplification node AN2 to the third transistor T33 based on the clock signal CLK. A gate of the fourth transistor T34 receives the clock signal CLK. A drain of the fourth transistor T34 is coupled to the second amplification node AN2. A source of the fourth transistor T34 is coupled to a drain of the third transistor T33. The transistors T33 and T34 are transistors of the same type as the transistors T31 and T32, and each may be an N-channel MOS transistor.

The reset circuit 350 includes a fifth transistor T35 and a sixth transistor T36. The fifth transistor T35 couples the node at the first power supply voltage V1 and the first amplification node AN1 based on the clock signal CLK. A gate of the fifth transistor T35 receives the clock signal CLK. A source of the fifth transistor T35 is connected to the node at the first power supply voltage V1. A drain of the fifth transistor T35 may be connected to the first amplification node AN1. The sixth transistor T36 couples the node at the first power supply voltage V1 and the second amplification node AN2 based on the clock signal CLK. A gate of the sixth transistor T36 receives the clock signal CLK. A source of the sixth transistor T36 is coupled to the first power supply voltage V1. A drain of the sixth transistor T36 is coupled to the second amplification node AN2. The transistors T35 and T36 are transistors of a type opposite to a type of the transistors T31, T32, T33, and T34, and transistors T35 and T36 may each be a P-channel MOS transistor.

The first compensation circuit 330 includes a seventh transistor T41, an eighth transistor T42, and a ninth transistor T43. The seventh transistor T41 is coupled to the first power supply voltage V1 and receives the reference voltage VREF. A gate of the seventh transistor T41 receives the reference voltage VREF, and a source of the seventh transistor T41 is coupled to the first power supply voltage V1. The eighth transistor T42 couples the seventh transistor T41 to the first compensation node CN1 based on the complementary signal CLKB of the clock signal CLK. A gate of the eighth transistor T42 receives the complementary signal CLKB of the clock signal CLK. A source of the eighth transistor T42 is coupled to a drain of the seventh transistor T41. A drain of the eighth transistor T42 is coupled to the first compensation node CN1. The ninth transistor T43 couples the first amplification node AN1 to the node at the second power supply voltage V2 based on the voltage level at the first compensation node CN1. A gate of the ninth transistor T43 is coupled to the first compensation node CN1. A drain of the ninth transistor T43 is coupled to the first amplification node AN1. A source of the ninth transistor T43 is coupled to the second power supply voltage V2. The transistors T41 and T42 are transistors of a type opposite to a type of the transistors T31, T32, T33, and T34, and transistors T41 and T42 may each be a P-channel MOS transistor. The ninth transistor T43 is a transistor of a type opposite to a type of the transistors T41 and T42 and may be an N-channel MOS transistor. The first compensation circuit 330 includes a tenth transistor T44. The tenth transistor T44 couples the first compensation node CN1 to the node at the second power supply voltage V2 based on the complementary signal CLKB of the clock signal CLK. A gate of the tenth transistor T44 receives the complementary signal CLKB of the clock signal CLK. A drain of the tenth transistor T44 is coupled to the first compensation node CN1. A source of the tenth transistor T44 is coupled to the second power supply voltage V2. The tenth transistor T44 is a transistor of the same type as the ninth transistor T43 and may be N-channel MOS transistor.

The second compensation circuit 340 includes an eleventh transistor T45, a twelfth transistor T46, and a thirteenth transistor T47. The eleventh transistor T45 is coupled to the first power supply voltage V1 and receives the input signal IN. A gate of the eleventh transistor T45 receives the input signal IN, and a source of the eleventh transistor T45 is coupled to the first power supply voltage V1. The twelfth transistor T46 couples the eleventh transistor T45 to the second compensation node CN2 based on the complementary signal CLKB of the clock signal CLK. A gate of the twelfth transistor T46 receives the complementary signal CLKB of the clock signal CLK. A source of the twelfth transistor T46 may be coupled to a drain of the eleventh transistor T45. A drain of the twelfth transistor T46 is coupled to the second compensation node CN2. The thirteenth transistor T47 couples the second amplification node AN2 to the node at the second power supply voltage V2 based on the voltage level at the second compensation node CN2. A gate of the thirteenth transistor T47 is coupled to the second compensation node CN2. A drain of the thirteenth transistor T47 is coupled to the second amplification node AN2. A source of the thirteenth transistor T47 may be coupled to the second power supply voltage V2. The transistors T45 and T46 are transistors of a type opposite to a type of the transistors T31, T32, T33, and T34, and transistors T45 and T46 may each be a P-channel MOS transistor. The thirteenth transistor T47 is a transistor of a type opposite to a type of the transistors T45 and T46 and may be an N-channel MOS transistor. The second compensation circuit 340 includes a fourteenth transistor T48. The fourteenth transistor T48 couples the second compensation node CN2 to the node at the second power supply voltage V2 based on the complementary signal CLKB of the clock signal CLK. A gate of the fourteenth transistor T48 receives the complementary signal CLKB of the clock signal CLK. A drain of the fourteenth transistor T48 is coupled to the second compensation node CN2. A source of the fourteenth transistor T48 is coupled to the second power supply voltage V2. The fourteenth transistor T48 is a transistor of the same type as the thirteenth transistor T47 and may be an N-channel MOS transistor.

The compensation circuits 330 and 340 have a structure capable of mitigating and/or reducing kickback noise as do the input circuits 310 and 320. The source of the seventh transistor T41 in the first compensation circuit 330 is coupled to the first power supply voltage V1. The source of the eleventh transistor T45 in the second compensation circuit 340 is coupled to the first power supply voltage V1. Due to the connection structure of the transistors T41 and T45, the voltage of first power supply voltage V1 is steadily applied to a parasitic capacitor formed between the gate and the source of the seventh transistor T41 and a parasitic capacitor formed between the gate and the source of the eleventh transistor T45. Even when the complementary signal CLKB of the clock signal CLK transitions from a high logic level to a low logic level, kickback noise in the voltage levels of the input signal IN and the reference voltage VREF may be mitigated and/or prevented.

The first input circuit 310 operates when the voltage level of the input signal IN is at or above a first predetermined voltage level, thereby changing the voltage level at the first amplification node AN1 according to the input signal IN. In an embodiment, the first input circuit 310 operates predominantly when the voltage level of the input signal IN is equal to or greater than a first predetermined voltage level, thereby changing the voltage level at the first amplification node AN1 according to the input signal IN. The second input circuit 320 operates when the voltage level of the reference voltage VREF is at or above the first predetermined voltage level, thereby changing the voltage level at the second amplification node AN2 according to the reference voltage VREF. In an embodiment, the second input circuit 320 operates predominantly when the voltage level of the reference voltage VREF is equal to or greater than the first predetermined voltage level, thereby changing the voltage level at the second amplification node AN2 according to the reference voltage VREF. The first compensation circuit 330 operates when the voltage level of the reference voltage VREF is at or below a second predetermined voltage level, thereby changing the voltage level at the first amplification node AN1 according to the reference voltage VREF. In an embodiment, the first compensation circuit 330 operates predominantly when the voltage level of the reference voltage VREF is equal to or below a second predetermined voltage level, thereby changing the voltage level at the first amplification node AN1 according to the reference voltage VREF. The second compensation circuit 340 operates when the voltage level of the input signal IN is at or below the second predetermined voltage level, thereby changing the voltage level at the second amplification node AN2 according to the input signal IN. In an embodiment, the second compensation circuit 340 operates predominantly when the voltage level of the input signal IN is equal to or below the second predetermined voltage level, thereby changing the voltage level at the second amplification node AN2 according to the input signal IN. For example, the first predetermined voltage level corresponds to the voltage level of the threshold voltage of the transistors T31 and T33, and the second predetermined voltage level corresponds to the voltage level of the threshold voltage of the transistors T41 and T45. When the compensation circuits 330 and 340 are not included, decreases in the voltage levels of the input signal IN and the reference voltage VREF due to fluctuations in the power supply voltage reduce response speed of the transistors T31 and T33, thereby increasing a time interval tCO. Time interval tCO refers to a time period from a point in time when a rising edge of the clock signal CLK occurs to a point in time when the comparator 100 generates the output signals OUTP and OUTN. When the first and second compensation circuits 330 and 340 are included, even when the voltage levels of the input signal IN and the reference voltage VREF decrease, the compensation circuits 330 and 340 complement the input circuits 310 and 320 to change the voltage levels of the amplification nodes AN1 and AN2, thereby increasing the response speed of the amplification circuit 300 and mitigating and/or preventing an increase in time interval tCO of the comparator 100. To optimize the power consumption of the comparator 100, current driving capability of the transistors included in the compensation circuits 330 and 340 may be smaller than the driving capability of the transistors included in the input circuits 310 and 320. In an embodiment, the size of the transistors included in the compensation circuits 330 and 340 is smaller than the size of the transistors included in the input circuits 310 and 320. The size includes a W/L ratio that represents a ratio of the width to the length of a channel of a transistor.

Figure 5A:
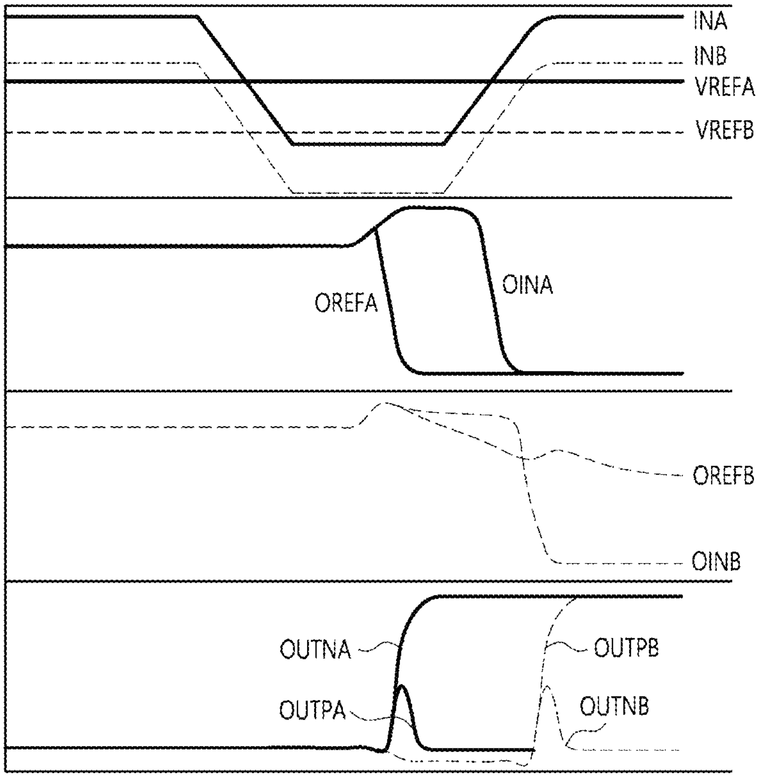
FIG. 5A is a timing diagram during operation of a comparator including the amplification circuit according to an embodiment.

FIG. 5A is a timing diagram during operation of the comparator 100, which includes, for example, the amplification circuit 200 illustrated in FIG. 2, in response to fluctuations in power supply voltage. The voltage level of the power supply voltage may vary due to process fluctuations and temperature fluctuations. Variations in power supply voltage may cause the voltage levels of the input signal IN and the reference voltage VREF to become lower than typical voltage levels. In FIG. 5A, the input signal IN and the reference voltage VREF at typical voltage levels are denoted as INA and VREFA, respectively, and the input signal IN and the reference voltage VREF at voltage levels lower than the typical voltage levels are denoted as INB and VREFB, respectively. When the input signal INA and the reference voltage VREFA are at typical voltage levels, the transistors T11 and T13 of the amplification circuit 200 are sufficiently turned on in response to the input signal INA and the reference voltage VREFA, respectively. When the voltage level of the input signal INA is lower than the voltage level of the reference voltage VREFA, the amplification circuit 200 amplifies the voltage level difference between the input signal INA and the reference voltage VREFA and generates the second amplified signal OREFA that transitions to a low logic level. The latch circuit 120 generates the first output signal OUTPA that transitions to a low logic level and the second output signal OUTNA that transitions to a high logic level based on the amplified signals OINA and OREFA. In an environment where the voltage level of the power supply voltage decreases, when the voltage levels of the input signal INB and the reference voltage VREFB are lower than typical voltage levels, the transistors T11 and T13 of the amplification circuit 200 might not be turned on sufficiently in response to the input signal INB and the reference voltage VREFB. When the voltage level of the input signal INB is lower than the voltage level of the reference voltage VREFB, the amplification circuit 200 generates the second amplified signal OREFB that transitions to a low logic level in response to the reference voltage VREFB. When the voltage level of the reference voltage VREFB is relatively low, a slope, along which the voltage level of the second amplified signal OREFB varies, becomes smaller, and the time for the second amplified signal OREFB to transition to a low logic level increases. Thus, a point in time at which the latch circuit 120 generates the output signals OUTPB and OUTNB when the input signal INB and the reference voltage VREFB have reduced voltage levels is delayed compared to a point in time at which the latch circuit 120 generates the output signals OUTPA and OUTNA when the input signal INA and the reference voltage VREFA have typical voltage levels. When the voltage level of the input signal INB is higher than the voltage level of the reference voltage VREFB when the point in time is delayed at which the output signals OUTPB and OUTNB are generated, the first amplified signal OINB transitions to a low logic level according to the first input signal INB, and based on the amplified signals OINB and OREFB, the first output signal OUTPB that transitions to a high logic level and the second output signal OUTNB that transitions to a low logic level are generated. Consequently, the output signals OUTPB and OUTNB corresponding to the logic level of the input signal INB fail to be generated while the input signal INB is at a voltage level lower than a voltage level of the reference voltage VREFB, and the output signals OUTPB and OUTNB are generated at logic levels opposite to the logic levels of the output signals OUTPA and OUTNA that are generated based on the input signal INA with typical voltage levels.

Figure 5B:
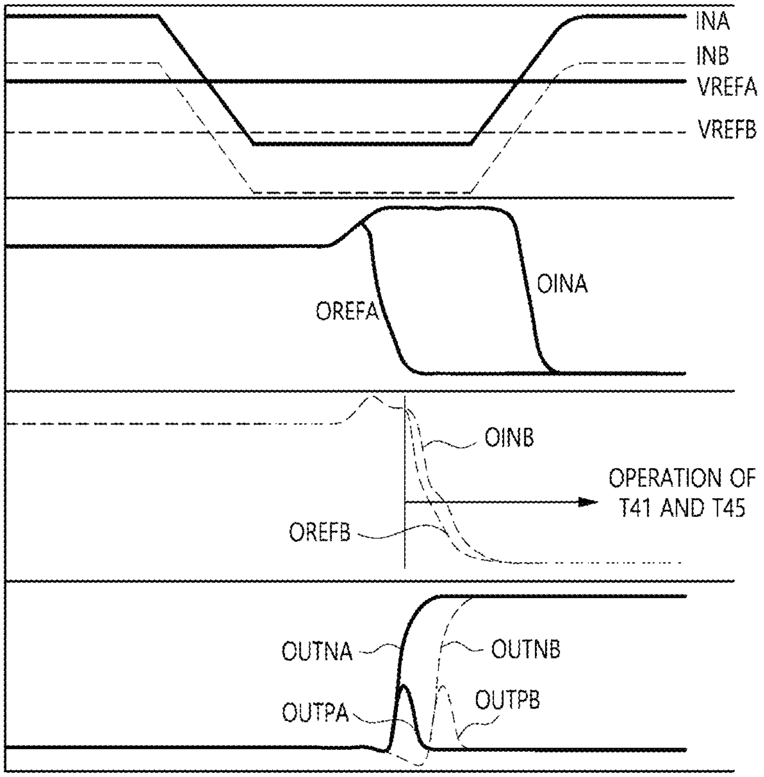
FIG. 5B is a timing diagram during operation of a comparator including the amplification circuit according to an embodiment.

FIG. 5B is a timing diagram during operation of the comparator 100, which includes, for example, the amplification circuit 300 illustrated in FIG. 4, in response to fluctuations in power supply voltage. Variations in power supply voltage may cause the voltage levels of the input signal IN and the reference voltage VREF to become lower than typical voltage levels. In FIG. 5B, the input signal IN and the reference voltage VREF at typical voltage levels are denoted as INA and VREFA, respectively, and the input signal IN and the reference voltage VREF at voltage levels lower than the typical voltage levels are denoted as INB and VREFB, respectively. When the input signal INA and the reference voltage VREFA are at typical voltage levels, the transistors T31 and T33 of the amplification circuit 300 are sufficiently turned on in response to the input signal INA and the reference voltage VREFA, respectively. When the voltage level of the input signal INA is lower than the voltage level of the reference voltage VREFA, the amplification circuit 300 amplifies the voltage level difference between the input signal INA and the reference voltage VREFA and generates the second amplified signal OREFA that transitions to a low logic level. The latch circuit 120 generates the first output signal OUTPA that transitions to a low logic level and the second output signal OUTNA that transitions to a high logic level based on the amplified signals OINA and OREFA. In an environment where the voltage level of the power supply voltage decreases, when the voltage levels of the input signal INB and the reference voltage VREFB are lower than typical voltage levels, the transistors T31 and T33 of the amplification circuit 300 might not be turned on sufficiently in response to the input signal INB and the reference voltage VREFB. When the transistors T41 and T45 of the compensation circuits 330 and 340 operate (predominantly) and amplify the voltage level difference between the input signal INB and the reference voltage VREFB. Even when the voltage levels of the input signal INB and the reference voltage VREFB are lower than typical voltage levels, the input signal INB and the reference voltage VREFB are sufficient to turn on the transistors T41 and T45. The first compensation circuit 330 decreases the voltage level of the first amplified signal OINB in response to the reference voltage VREFB. The second compensation circuit 340 decreases the voltage level of the second amplified signal OREFB in response to the input signal INB. The voltage level of the second amplified signal OREFB decreases more rapidly than the voltage level of the first amplified signal OINB. The latch circuit 120 detects a voltage level difference between the amplified signals OINB and OREFB and generates the first output signal OUTPB at a low logic level and the second output signal OUTNB at a high logic level. Accordingly, in an environment where the voltage level of the power supply voltage is reduced, the point in time at which the output signals OUTPB and OUTNB are generated is earlier than the point in time at which the first and second output signals OUTPB and OUTNB are generated as shown in FIG. 5A, and an increase in time interval tCO of the comparator 100 may be mitigated and/or prevented.

Figure 6:
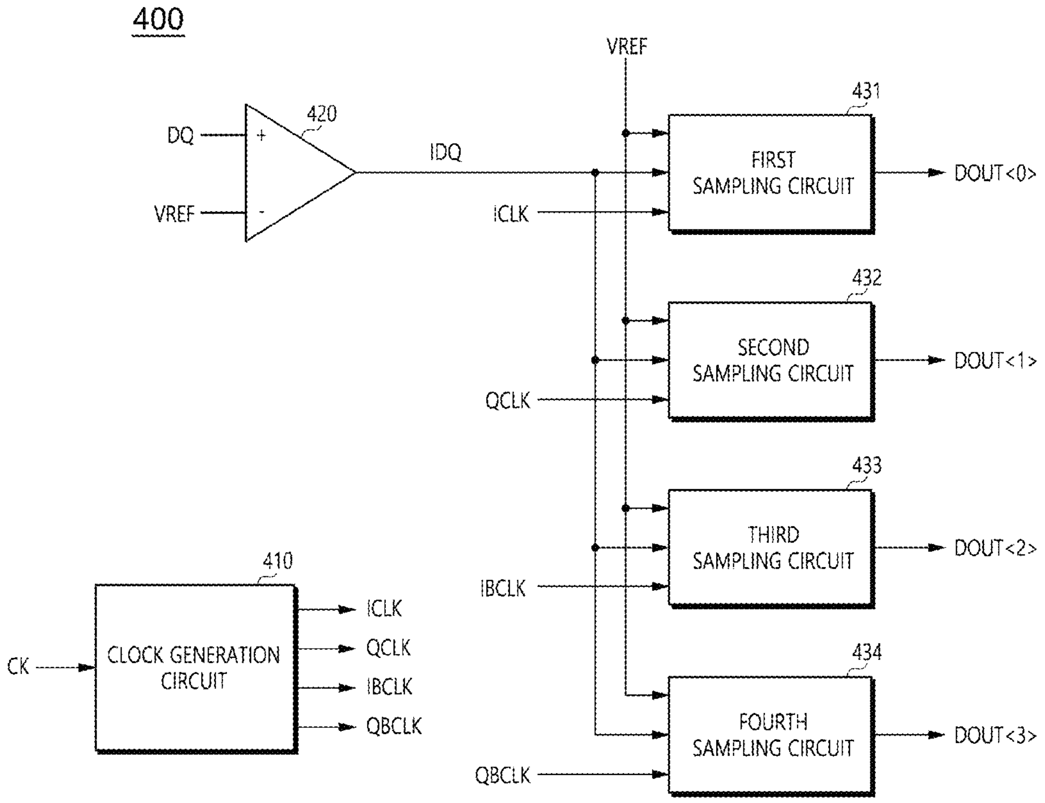
FIG. 6 is a diagram illustrating a configuration of a semiconductor apparatus in accordance with an embodiment.

FIG. 6 is a diagram illustrating a configuration of a semiconductor apparatus 400 in accordance with an embodiment. Referring to FIG. 6, the semiconductor device 400 includes a clock generation circuit 410, a data receiver 420, and a plurality of sampling circuits 431, 432, 433, 434. The clock generation circuit 410 receives a clock signal CK and generates a plurality of internal clock signals based on the clock signal CK. The plurality of internal clock signals includes internal clock signals ICLK, QCLK, IBCLK, and QBCLK. The first internal clock signal ICLK has a phase that leads the second internal clock signal QCLK by 90 degrees. The second internal clock signal QCLK has a phase that leads the third internal clock signal IBCLK by 90 degrees. The third internal clock signal IBCLK has a phase that leads the fourth internal clock signal QBCLK by 90 degrees. The fourth internal clock signal QBCLK has a phase that leads the first internal clock signal ICLK by 90 degrees. The internal clock signals ICLK, QCLK, IBCLK, and QBCLK each have a frequency lower than a frequency of the clock signal CK. The clock generation circuit 410 generates the internal clock signals ICLK, QCLK, IBCLK, and QBCLK by dividing the frequency of the clock signal CK. The clock generation circuit 410 includes a clock division circuit that divides the frequency of the clock signal CK. In an embodiment, the clock generation circuit 410 includes components such as a delay circuit and/or a duty cycle correction circuit that optimize the phases and duty cycles of the internal clock signals ICLK, QCLK, IBCLK, and QBCLK.

The data receiver 420 receives a data signal DQ and a reference voltage VREF and generates an input data signal IDQ. The data receiver 420 generates the input data signal IDQ by differentially amplifying the data signal DQ and the reference voltage VREF. The data receiver 420 outputs the input data signal IDQ to the plurality of sampling circuits. The data receiver 420 may be a differential amplifier or a continuous time linear equalizer (CTLE). The input data signal IDQ may be serial data in which a plurality of data bits is transmitted as a single data stream.

The plurality of sampling circuits 431, 432, 433, 434 generate a plurality of output data signals from the plurality of data bits included in the input data signal IDQ in synchronization with the internal clock signals ICLK, QCLK, IBCLK, and QBCLK, respectively. The semiconductor apparatus includes a first sampling circuit 431, a second sampling circuit 432, a third sampling circuit 433, and a fourth sampling circuit 434. The first sampling circuit 431 receives the first internal clock signal ICLK, the input data signal IDQ, and the reference voltage VREF. The first sampling circuit 431 generates the first output data signal DOUT<0> by comparing the input data signal IDQ with the reference voltage VREF in synchronization with the first internal clock signal ICLK. When the first internal clock signal ICLK is at a first logic level, the first sampling circuit 431 generates the first output data signal DOUT<0> based on the input data signal IDQ and the reference voltage VREF. When the first internal clock signal ICLK is at a second logic level, the first sampling circuit 431 maintains the logic level of the first output data signal DOUT<0>. The second sampling circuit 432 receives the second internal clock signal QCLK, the input data signal IDQ, and the reference voltage VREF. The second sampling circuit 432 generates the second output data signal DOUT<1> by comparing the input data signal IDQ with the reference voltage VREF in synchronization with the second internal clock signal QCLK. When the second internal clock signal QCLK is at a first logic level, the second sampling circuit 432 generates the second output data signal DOUT<1> based on the input data signal IDQ and the reference voltage VREF. When the second internal clock signal QCLK is at a second logic level, the second sampling circuit 432 maintains the logic level of the second output data signal DOUT<1>. The third sampling circuit 433 receives the third internal clock signal IBCLK, the input data signal IDQ, and the reference voltage VREF. The third sampling circuit 433 generates the third output data signal DOUT<2> by comparing the input data signal IDQ with the reference voltage VREF in synchronization with the third internal clock signal IBCLK. When the third internal clock signal IBCLK is at a first logic level, the third sampling circuit 433 generates the third output data signal DOUT<2> based on the input data signal IDQ and the reference voltage VREF. When the third internal clock signal IBCLK is at a second logic level, the third sampling circuit 433 maintains the logic level of the third output data signal DOUT<2>. The fourth sampling circuit 434 receives the fourth internal clock signal QBCLK, the input data signal IDQ, and the reference voltage VREF. The fourth sampling circuit 434 generates the fourth output data signal DOUT<3> by comparing the input data signal IDQ with the reference voltage VREF in synchronization with the fourth internal clock signal QBCLK. When the fourth internal clock signal QBCLK is at a first logic level, the fourth sampling circuit 434 generates the fourth output data signal DOUT<3> based on the input data signal IDQ and the reference voltage VREF. When the fourth internal clock signal QBCLK is at a second logic level, the fourth sampling circuit 434 maintains the logic level of the fourth output data signal DOUT<3>. The sampling circuits 431, 432, 433, and 434 may each include the comparator 100 illustrated in FIG. 1. The comparator 100 may include the amplification circuit 200 illustrated in FIG. 2 or the amplification circuit 300 illustrated in FIG. 4. The sampling circuits 431, 432, 433, and 434 are insensitive to or unaffected by kickback noise generate and may rapidly and accurately generate the output data signals DOUT<0>, DOUT<1>, DOUT<2>, and DOUT<3>, respectively, from the input data signal IDQ, each sampling circuits 431, 432, 433, and 434 using a comparator that is insensitive or resilient to fluctuations in the power supply voltage.

Concepts are disclosed in conjunction with examples and embodiments. Those skilled in the art will understand that various modifications, additions, combinations, and substitutions are possible without departing from the scope and technical concepts of the present disclosure. The embodiments disclosed in the present specification should be considered from an illustrative standpoint and not a restrictive standpoint. Therefore, the scope of the present disclosure is not limited to these descriptions. All changes within the meaning and range of equivalency of the claims are included within their scope.

What is claimed is:

1. A comparator comprising:

an amplification circuit configured to generate a first amplified signal and a second amplified signal by differentially amplifying an input signal and a reference voltage when a clock signal is at a first logic level and to reset the first amplified signal and the second amplified signal when the clock signal is at a second logic level; and a latch circuit configured to generate a first output signal and a second output signal based on the first amplified signal and the second amplified signal when the clock signal is at the first logic level and to reset the first output signal and the second output signal when the clock signal is at the second logic level;

wherein the amplification circuit comprises:

a first amplification node and a second amplification node that are coupled to a first power supply voltage based on the clock signal;

a first transistor coupled to a second power supply voltage and configured to receive the input signal;

a second transistor configured to couple the first amplification node to the first transistor based on the clock signal;

a third transistor coupled to the second power supply voltage and configured to receive the reference voltage; and a fourth transistor configured to couple the second amplification node and the third transistor based on the clock signal; and wherein the first amplified signal is output on the first amplification node, and the second amplified signal is output on the second amplification node.

2. The comparator of claim 1, wherein the amplification circuit further comprises:

a fifth transistor configured to couple the node at the first power supply voltage and the first amplification node based on the clock signal; and a sixth transistor configured to couple the node at the first power supply voltage and the second amplification node based on the clock signal;

wherein each of the fifth transistor and the sixth transistor comprises a transistor of a type opposite to a type of the first transistor, the second transistor, the third transistor, and the fourth transistor.

3. The comparator of claim 1, wherein each of the first transistor, the second transistor, the third transistor, and the fourth transistor comprises an N-channel metal-oxide-semiconductor (MOS) transistor.

4. A comparator comprising:

an amplification circuit configured to generate a first amplified signal and a second amplified signal by differentially amplifying an input signal and a reference voltage when a clock signal is at a first logic level and to reset the first amplified signal and the second amplified signal when the clock signal is at a second logic level; and a latch circuit configured to generate a first output signal and a second output signal based on the first amplified signal and the second amplified signal when the clock signal is at the first logic level and to reset the first output signal and the second output signal when the clock signal is at the second logic level;

wherein the amplification circuit comprises:

a first amplification node and a second amplification node coupled to a first power supply voltage based on the clock signal;

a first transistor coupled to a second power supply voltage and configured to receive the input signal;

a second transistor configured to couple the first amplification node and the first transistor based on the clock signal;

a third transistor coupled to the second power supply voltage and configured to receive the reference voltage;

a fourth transistor configured to couple the second amplification node and the third transistor based on the clock signal;

a first compensation circuit configured to change a voltage level at the first amplification node based on the reference voltage; and a second compensation circuit configured to change a voltage level at the second amplification node based on the input signal; and wherein the first amplified signal is output on the first amplification node, and the second amplified signal is output on the second amplification node.

5. The comparator of claim 4, wherein the amplification circuit further comprises:

a fifth transistor configured to couple the node at the first power supply voltage and the first amplification node based on the clock signal;

a sixth transistor configured to couple the node at the first power supply voltage and the second amplification node based on the clock signal; and wherein each of the fifth transistor and the sixth transistor comprises a transistor of a type opposite to a type of the first transistor, the second transistor, the third transistor, and the fourth transistor.

6. The comparator of claim 4, wherein each of the first transistor, the second transistor, the third transistor, and the fourth transistors comprises an N-channel metal-oxide-semiconductor (MOS) transistor.

7. The comparator of claim 4, wherein the first compensation circuit comprises:

a seventh transistor coupled to the first power supply voltage and configured to receive the reference voltage;

an eighth transistor configured to couple the seventh transistor and a first compensation node based on a complementary signal of the clock signal; and a ninth transistor configured to couple, based on a voltage level at the first compensation node, the first amplification node to the second power supply voltage; and wherein each of the seventh transistor and the eighth transistor comprises a transistor of a type opposite to a type of the first transistor, the second transistor, the third transistor, and the fourth transistor, and the ninth transistor comprises a transistor of a type opposite to the type of the seventh transistor and the eighth transistor.

8. The comparator of claim 7, wherein the first compensation circuit further comprises a tenth transistor configured to couple, based on the complementary signal of the clock signal, the first compensation node to the node at the second power supply voltage; and wherein the tenth transistor comprises a transistor of a type similar to the type of the ninth transistor.

9. The comparator of claim 7, wherein the second compensation circuit comprises:

an eleventh transistor coupled to the first power supply voltage and configured to receive the input signal;

a twelfth transistor configured to couple the eleventh transistor and a second compensation node based on the complementary signal of the clock signal; and a thirteenth transistor configured to couple, based on a voltage level at the second compensation node, the second amplification node to the second power supply voltage; and wherein each of the eleventh transistor and the twelfth transistor comprises a transistor of a type opposite to a type of the first transistor, the second transistor, the third transistor, and the fourth transistor, and the thirteenth transistor comprises a transistor of a type opposite to the type of the eleventh transistor and the twelfth transistor.

10. The comparator of claim 9, wherein the second compensation circuit further comprises a fourteenth transistor configured to couple, based on the complementary signal of the clock signal, the second compensation node to the node at the second power supply voltage; and wherein the fourteenth transistor comprises a transistor of a type similar to the type of the thirteenth transistor.

11. A comparator comprising:

an amplification circuit configured to generate a first amplified signal and a second amplified signal by differentially amplifying an input signal and a reference voltage when a clock signal is at a first logic level and to reset the first amplified signal and the second amplified signal when the clock signal is at a second logic level; and a latch circuit configured to generate a first output signal and a second output signal based on the first amplified signal and the second amplified signal when the clock signal is at the first logic level and to reset the first output signal and the second output signal when the clock signal is at the second logic level;

wherein the amplification circuit comprises:

a first input circuit configured to decrease a voltage level at a first amplification node when the input signal is at or above a first voltage level and output the first amplified signal on the first amplification node;

a second input circuit configured to decrease a voltage level at a second amplification node when the reference voltage is at or above the first voltage level and output the second amplified signal on the second amplification node;

a first compensation circuit configured to decrease the voltage level at the first amplification node when the reference voltage is at or below a second voltage level; and a second compensation circuit configured to decrease the voltage level at the second amplification node when the input signal is at or below the second voltage level.

12. The comparator of claim 11, wherein the first amplification node and the second amplification node are coupled to a first power supply voltage based on the clock signal;

wherein the first input circuit comprises:

a first transistor coupled to a second power supply voltage and configured to receive the input signal; and a second transistor configured to couple the first amplification node to the first transistor based on the clock signal; and wherein the second input circuit comprises:

a third transistor coupled to the second power supply voltage and configured to receive the reference voltage; and a fourth transistor configured to couple the second amplification node to the third transistor based on the clock signal.

13. The comparator of claim 12, further comprising a reset circuit configured to reset the first amplification node and the second amplification node to a voltage level at the first power supply voltage based on the clock signal, wherein the reset circuit further comprises:

a fifth transistor configured to couple, based on the clock signal, the first amplification node and the node at the first power supply voltage; and a sixth transistor configured to couple, based on the clock signal, the second amplification node and the node at the first power supply voltage.

14. The comparator of claim 12, wherein the first compensation circuit comprises:

a seventh transistor coupled to the first power supply voltage and configured to receive the reference voltage;

an eighth transistor configured to couple the seventh transistor to a first compensation node based on a complementary signal of the clock signal; and a ninth transistor configured to couple, based on a voltage level at the first compensation node, the first amplification node to the node at the second power supply voltage; and wherein each of the seventh transistor and the eighth transistor comprises a transistor of a type different from a type of the first transistor, the second transistor, the third transistor, and the fourth transistor, and the ninth transistor comprises a transistor of a type opposite to the type of the seventh transistor and the eighth transistor.

15. The comparator of claim 14, wherein the first compensation circuit further comprises a tenth transistor configured to couple, based on the complementary signal of the clock signal, the first compensation node to the node at the second power supply voltage; and wherein the tenth transistor comprises a transistor of a type similar to the type of the ninth transistor.

16. The comparator of claim 12, wherein the second compensation circuit comprises:

an eleventh transistor coupled to the first power supply voltage and configured to receive the input signal;

a twelfth transistor configured to couple the eleventh transistor to a second compensation node based on a complementary signal of the clock signal; and a thirteenth transistor configured to couple, based on a voltage level at the second compensation node, the second amplification node to the node at the second power supply voltage; and wherein each of the eleventh transistor and the twelfth transistor comprises a transistor of a type opposite to a type of the first transistor, the second transistor, the third transistor, and the fourth transistor, and the thirteenth transistor comprises a transistor of a type opposite to the type of the eleventh transistor and the twelfth transistor.

17. The comparator of claim 16, wherein the second compensation circuit further comprises a fourteenth transistor configured to couple, based on the complementary signal of the clock signal, the second compensation node to the node at the second power supply voltage; and wherein the fourteenth transistor comprises a transistor of a type similar to the type of the thirteenth transistor.

18. An amplification circuit comprising:

a first input circuit configured to change a voltage level at an amplification node when an input signal is at or above a first voltage level, such that a first amplified signal is output on the first amplification node;

a second input circuit configured to change a voltage level at a second amplification node when a reference voltage is at or above a first voltage level, such that a second amplified signal is output on the second amplification node;

a first compensation circuit configured to decrease a voltage level at the first amplification node when the reference voltage is at or below a second voltage level; and a second compensation circuit configured to decrease the voltage level at the second amplification node when the input signal is at or below the second voltage level.

19. The amplification circuit of claim 18, wherein the first amplification node and the second amplification node are coupled to a first power supply voltage based on the clock signal;

wherein the first input circuit comprises:

a first transistor coupled to a second power supply voltage and configured to receive the input signal; and a second transistor configured to couple the first amplification node to the first transistor based on a clock signal, and wherein the second input circuit comprises:

a third transistor coupled to the second power supply voltage and configured to receive the reference voltage; and a fourth transistor configured to couple the second amplification node to the third transistor based on the clock signal.

20. The amplification circuit of claim 19, further comprising a reset circuit configured to reset the first amplification node and the second amplification node to a voltage level at the first power supply voltage based on the clock signal, wherein the reset circuit further comprises:

a fifth transistor configured to couple, based on the clock signal, the first amplification node and the node at the first power supply voltage; and a sixth transistor configured to couple, based on the clock signal, the second amplification node and the node at the first power supply voltage.

21. The amplification circuit of claim 19, wherein the first compensation circuit comprises:

a seventh transistor coupled to the first power supply voltage and configured to receive the reference voltage;

an eighth transistor configured to couple the seventh transistor to a first compensation node based on a complementary signal of the clock signal; and a ninth transistor configured to couple, based on a voltage level at the first compensation node, the first amplification node to the node at the second power supply voltage; and wherein each of the seventh transistor and the eighth transistor comprises a transistor of a type different from a type of the first transistor, the second transistor, the third transistor, and the fourth transistor, and the ninth transistor comprises a transistor of a type opposite to the type of the seventh transistor and the eighth transistor.

22. The amplification circuit of claim 21, wherein the first compensation circuit further comprises a tenth transistor configured to couple, based on the complementary signal of the clock signal, the first compensation node to the node at the second power supply voltage; and wherein the tenth transistor comprises a transistor of a type similar to the type of the ninth transistor.

23. The amplification circuit of claim 19, wherein the second compensation circuit comprises:

an eleventh transistor coupled to the first power supply voltage and configured to receive the input signal;

a twelfth transistor configured to couple the eleventh transistor to a second compensation node based on a complementary signal of the clock signal; and a thirteenth transistor configured to couple, based on a voltage level at the second compensation node, the second amplification node to the node at the second power supply voltage; and wherein each of the eleventh transistor and the twelfth transistor comprises a transistor of a type opposite to a type of the first transistor, the second transistor, the third transistor, and the fourth transistor, and the thirteenth transistor comprises a transistor of a type opposite to the type of the eleventh transistor and the twelfth transistor.

24. The amplification circuit of claim 23, wherein the second compensation circuit further comprises a fourteenth transistor configured to couple, based on the complementary signal of the clock signal, the second compensation node to the node at the second power supply voltage; and wherein the fourteenth transistor comprises a transistor of a type similar to the type of the thirteenth transistor.

25. The amplification circuit of claim 18, wherein the first compensation circuit is configured to decrease a voltage level at the first amplification node more predominantly than the first input circuit when the reference voltage is at or below the second voltage level; and wherein the second compensation circuit is configured to decrease the voltage level at the second amplification node more predominantly than the second input circuit when the input signal is at or below the second voltage level.

* * * * *